United States Patent
Jin et al.

(10) Patent No.: US 8,895,999 B2
(45) Date of Patent: Nov. 25, 2014

(54) ORGANIC LIGHT-EMITTING DISPLAY DEVICE AND METHOD OF MANUFACTURING THE SAME

(75) Inventors: Guang-Hai Jin, Yongin (CN); Jae-Beom Choi, Yongin (KR); Kwan-Wook Jung, Yongin (KR); June-Woo Lee, Yongin (KR); Moo-Jin Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 219 days.

(21) Appl. No.: 13/469,075

(22) Filed: May 10, 2012

(65) Prior Publication Data

US 2013/0134423 A1 May 30, 2013

(30) Foreign Application Priority Data

Nov. 25, 2011 (KR) .......................... 10-2011-0124400

(51) Int. Cl.
  *H01L 33/00* (2010.01)
  *H01L 33/08* (2010.01)
  *H01L 33/38* (2010.01)

(52) U.S. Cl.
  CPC ................ *H01L 33/08* (2013.01); *H01L 33/38* (2013.01)
  USPC ................ 257/88; 257/40; 257/296; 438/34; 438/250

(58) Field of Classification Search
  CPC ......... H01L 33/08; H01L 33/20; H01L 21/28; H01L 33/38
  USPC .......................... 257/40, 88, 296; 438/34, 250
  See application file for complete search history.

(56) References Cited

U.S. PATENT DOCUMENTS

2002/0106847 A1* 8/2002 Kazlas et al. ................. 438/200
2011/0240999 A1* 10/2011 You ................................. 257/59
2012/0097967 A1* 4/2012 Choi et al. ...................... 257/72

FOREIGN PATENT DOCUMENTS

JP         09-064356     3/1997
KR   10-2008-0069892 A  7/2008

* cited by examiner

*Primary Examiner* — Telly Green
*Assistant Examiner* — Jamie C Niesz
(74) *Attorney, Agent, or Firm* — Christie, Parker & Hale, LLP

(57) ABSTRACT

A method of manufacturing an organic light-emitting display device is disclosed. The method includes: uniformly forming an active layer on an entire surface of a substrate on which an organic light-emitting diode, a thin film transistor (TFT), and a capacitor are to be formed; performing a first mask process on the active layer to form a pixel electrode of the organic light-emitting diode, a gate electrode of the TFT, and an upper electrode of the capacitor; performing a second mask process to form an insulating layer having openings that expose the pixel electrode, the upper electrode, and the active layer in a region of the TFT; performing a third mask process to form a source-drain electrode that contacts an exposed portion of the active layer; and performing a fourth mask process to form a pixel-defining layer (PDL) that exposes the pixel electrode and covers the TFT and the capacitor.

7 Claims, 8 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2011-0124400, filed on Nov. 25, 2011 in the Korean Intellectual Property Office, the entire content of which is incorporated herein by reference.

BACKGROUND

1. Field

Aspects of embodiments of the present invention relate to an organic light-emitting display device and a method of manufacturing the organic light-emitting display device.

2. Description of Related Art

An organic light-emitting display device may be formed on a substrate on which a pattern that includes a thin film transistor (TFT), a capacitor, or the like, and wiring for connecting them, is formed. In order to form a micro-pattern including a TFT or the like on a substrate on which an organic light-emitting display device is formed, the micro-pattern may be transferred to the substrate by using a mask having the micro-pattern formed thereon.

A process of transferring a pattern by using a mask may be performed via a photolithography process. According to the photolithography process, photoresist is uniformly coated on a substrate on which a pattern is to be formed, the photoresist is exposed by using an exposing device such as a stepper, and then (in a case of positive photoresist) the sensitized photoresist is developed. In addition, after the photoresist is developed, the pattern is etched by using the residual photoresist as a mask, and an unnecessary portion of the photoresist is removed.

In the aforementioned process of transferring a pattern by using a mask, a mask having a desired pattern formed thereon may need to be aligned with the substrate. Thus, as the number of processes using a mask increases, the manufacturing costs may also increase due to the alignment of the mask. Accordingly, a structure in which the number of times of using a mask can be decreased is desired.

SUMMARY

Aspects of embodiments of the present invention relate to an organic light-emitting display device and a method of manufacturing the organic light-emitting display device. Further aspects relate to an organic light-emitting display device and a method of manufacturing the organic light-emitting display device designed to reduce the number of times a mask is used during a manufacturing procedure. Still further aspects relate to an organic light-emitting display device that reduces a number of patterning processes using a mask, and a method of manufacturing the organic light-emitting display device.

According to an exemplary embodiment of the present invention, an organic light-emitting display device is provided. The organic light-emitting display device includes a substrate, an active layer uniformly covering an entire surface of the substrate, a thin film transistor (TFT) on the substrate and including a portion of the active layer, and an organic light-emitting diode and a capacitor on the substrate and that are electrically connected to the TFT.

The TFT may include a gate electrode on the active layer with a gate insulating layer therebetween, a source-drain electrode connected to the active layer, and a gate guard surrounding the gate electrode to define a region of the TFT.

The gate electrode and the gate guard may be formed in a same layer by using a same material.

The TFT may include a plurality of TFTs of which corresponding said regions are separately defined by respective said gate guards.

The gate electrode may include a gate center portion, and a gate side portion extending from the gate center portion and forming a closed loop shape with the gate center portion.

The source-drain electrode may pass through a central space of the closed loop shape to connect to the active layer via the central space.

The capacitor may include a lower electrode including a portion of the active layer, and an upper electrode corresponding to the lower electrode.

The upper electrode may include a first upper electrode corresponding to the lower electrode, and a second upper electrode surrounding a side edge of the first upper electrode and having a closed loop shape.

The organic light-emitting diode may include a pixel electrode electrically connected to the TFT, an opposite electrode facing the pixel electrode, and an emission layer interposed between the pixel electrode and the opposite electrode.

According to another exemplary embodiment of the present invention, a method of manufacturing an organic light-emitting display device is provided. The method includes: uniformly forming an active layer on an entire surface of a substrate on which an organic light-emitting diode, a thin film transistor (TFT), and a capacitor are to be formed; performing a first mask process in which patterns for a pixel electrode of the organic light-emitting diode, a gate electrode of the TFT, and an upper electrode of the capacitor are formed on the active layer; performing a second mask process of forming an insulating layer having openings that expose the pixel electrode, the upper electrode, and the active layer in a region of the TFT; performing a third mask process of forming a source-drain electrode that contacts an exposed portion of the active layer; and performing a fourth mask process of forming a pixel-defining layer (PDL) that exposes the pixel electrode and covers the TFT and the capacitor.

The first mask process may further include forming a gate guard in a same layer as the gate electrode by using a same material as the gate electrode to define the region of the TFT. The gate guard may surround the gate electrode.

The gate electrode may include a gate center portion, and a gate side portion extending from the gate center portion and forming a closed loop shape with the gate center portion.

The method may further include doping the active layer with impurities by using the gate electrode and the gate guard as a mask.

The upper electrode of the capacitor may include a first upper electrode, and a second upper electrode having a closed loop shape surrounding a side edge of the first upper electrode.

The method may further include doping the active layer with impurities by using the second upper electrode as a mask to form a lower electrode facing the first upper electrode.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
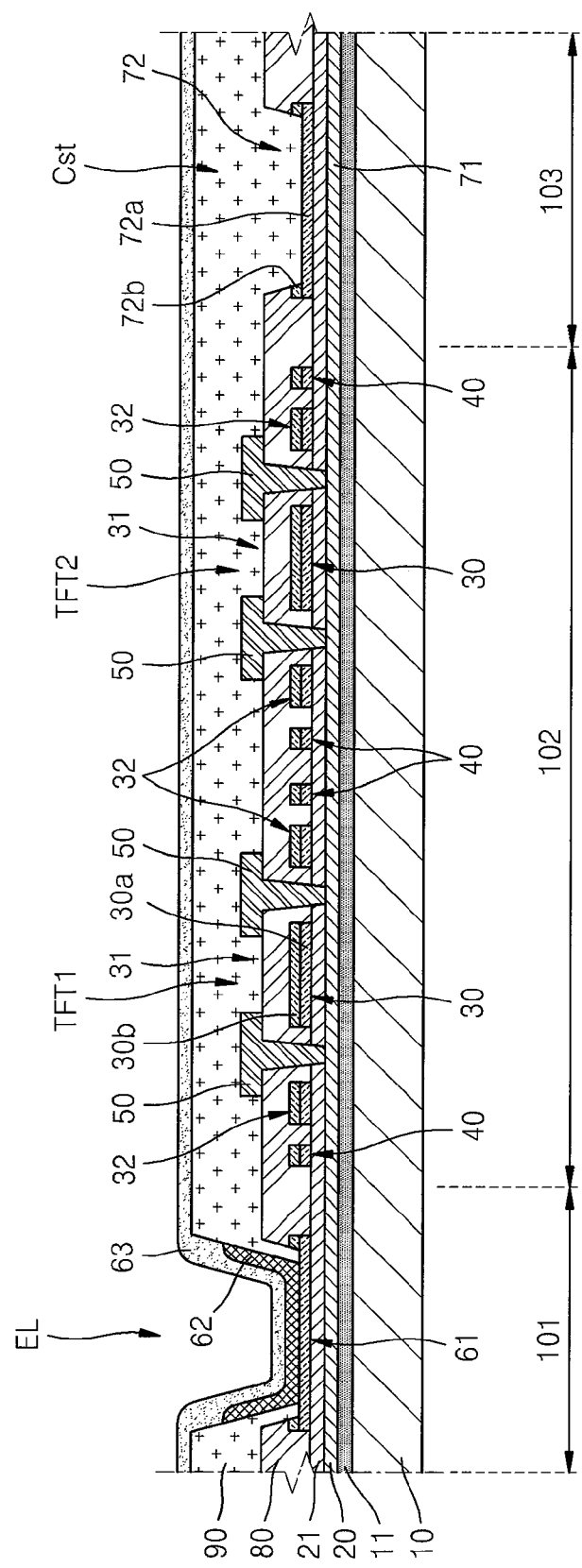
FIG. 1 is a cross-sectional view of a portion of an organic light-emitting display device according to an embodiment of the present invention.

Hereinafter, the present invention will be described in detail by explaining exemplary embodiments of the invention with reference to the attached drawings. Like reference numerals in the drawings denote like elements. In the following description, well-known functions or constructions are not described in detail since they would obscure the disclosure with unnecessary detail.

In the drawings, the thicknesses of layers and regions may be exaggerated for clarity. In addition, throughout the specification, it will also be understood that when an element such as a layer, region, or substrate is referred to as being "on" another element, it can be directly on the other element, or intervening elements may also be present. Further, expressions such as "at least one of," when preceding a list of elements, modify the entire list of elements and do not modify the individual elements of the list.

FIG. 1 is a cross-sectional view of a portion of a bottom emission type organic light-emitting display device according to an embodiment of the present invention.

Referring to FIG. 1, the light-emitting display device defines an emission region 101, a switch region 102, and a storage region 103. In the switch region 102, thin film transistors (TFTs) TFT1 and TFT2 are arranged as driving devices. Here, TFT1 may correspond to a driving transistor that is connected to the emission region 101, and TFT2 may correspond to a switching transistor that delivers a driving signal to the driving transistor (i.e., TFT1). In this regard, TFT1 and TFT2 have the same thin film layered structure. That is, each of TFT1 and TFT2 has a structure in which an active layer 20, a gate electrode 30, and one or more source-drain electrodes 50 are layered. The gate electrode 30 is formed of a lower gate electrode 30a (hereinafter, a first electrode) and an upper gate electrode 30b (hereinafter, a second electrode). The first electrode 30a is formed of a transparent conductive material.

Figure 2A:
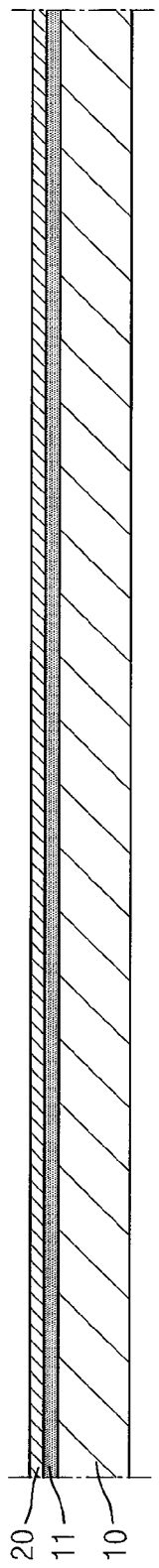
FIGS. 2A through 2H are cross-sectional views that sequentially illustrate a process of manufacturing the organic light-emitting display device of FIG. 1.
Figure 2B:
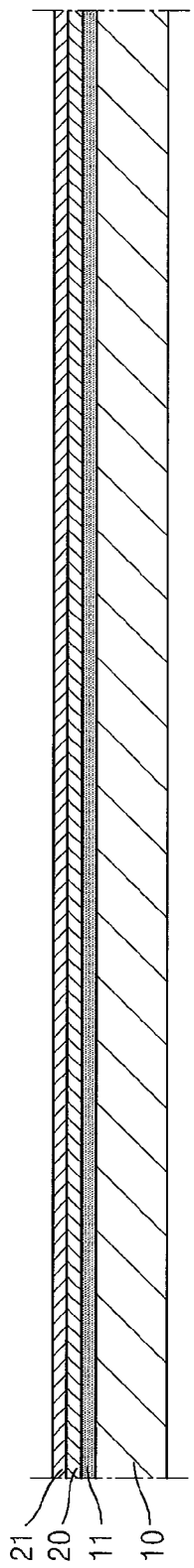
Figure 2C:
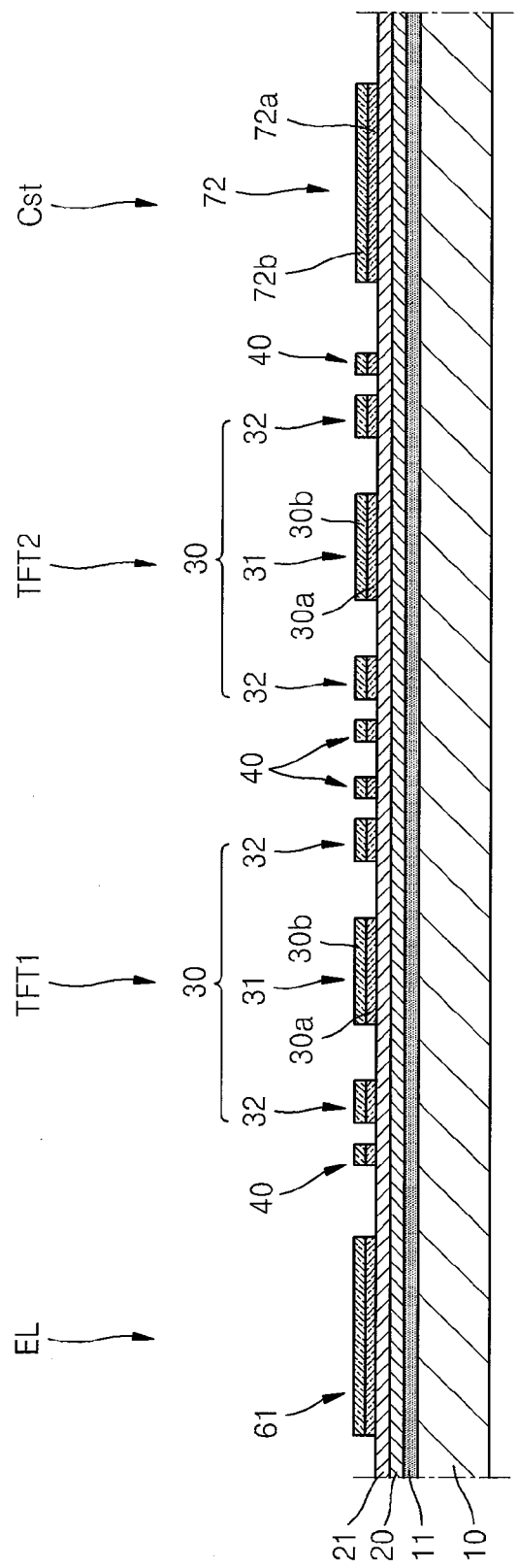
Figure 2D:
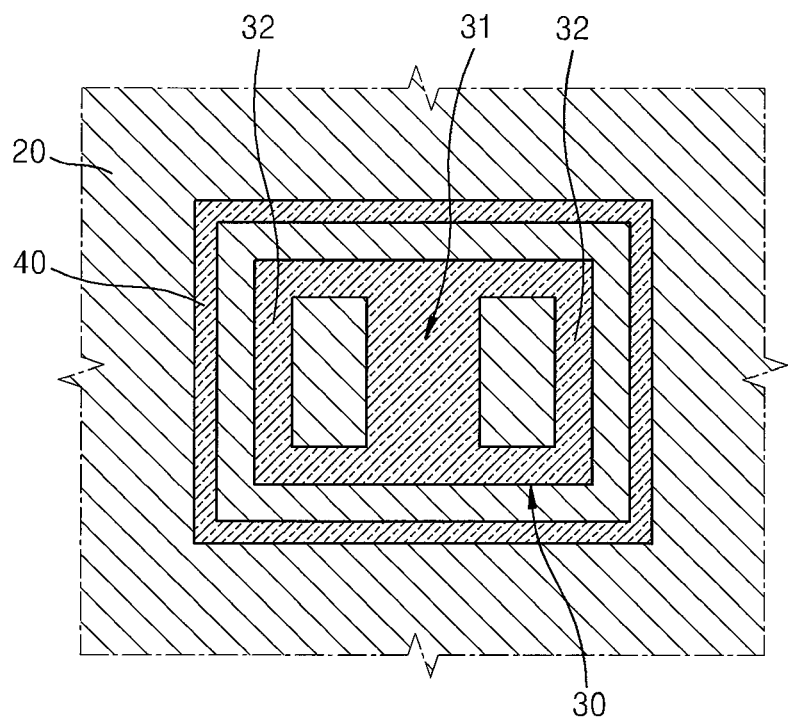

As illustrated in FIGS. 1 and 2D, each gate electrode 30 is formed of a gate center portion 31 and gate side portions 32 extending from the gate center portion 31. Each of the gate side portions 32 forms a closed loop shape with the center portion 31, the closed-loop shape defining a central space where the gate electrode 30 is not formed. Each source-drain electrode 50 is connected to the active layer 20 via the central space of the closed loop corresponding to one of the gate side portions 32. Reference numeral 21 indicates a gate insulating layer (hereinafter, a first insulating layer) interposed between the gate electrode 30 and the active layer 20.

However, as shown in FIG. 1, the active layer 20 is formed not only in the switch region 102 including TFT1 and TFT2 but also is formed in the emission region 101 and the storage region 103. That is, the active layer 20 is uniformly formed in an entire region on a substrate 10. In other words, the active layer 20 is not separately patterned, but is instead formed on an entire surface of the substrate 10. By doing so, a mask process of patterning the active layer 20 may be omitted so that an organic light-emitting display device manufacturing process may be simplified.

When the active layer 20 is not patterned and is instead uniformly formed on the entire surface of the substrate 10, TFT1 and TFT2 (being adjacent to each other) are not electrically separated. Accordingly, a short may occur. In order to prevent the short, a gate guard 40 that surrounds the gate electrode 30 is formed in the same layer in which the gate electrode 30 is formed. The gate guard 40 functions to electrically separate regions of TFT1 and TFT2. A detailed description thereof appears below.

Next, an organic light-emitting diode EL is arranged in the emission region 101. The organic light-emitting diode EL is formed of a pixel electrode 61 and an opposite electrode 63 that face each other, with an emission layer 62 interposed therebetween. The pixel electrode 61 is formed of a transparent conductive material, is electrically connected to one of the source-drain electrodes 50 of the driving transistor (i.e., TFT1), and is concurrently formed (e.g., simultaneously formed) with the gate electrode 30 of TFT1 and TFT2.

A capacitor Cst is arranged in the storage region 103. The capacitor Cst is formed of a lower electrode 71 and an upper electrode 72, and the first insulating layer 21 is interposed therebetween. The upper electrode 72 of the capacitor Cst is concurrently formed (e.g., simultaneously formed) with the gate electrode 30 of TFT1 and TFT2, as well as the pixel electrode 61 of the organic light-emitting diode EL. The capacitor Cst is electrically connected to the driving transistor (i.e., TFT1).

Figure 2E:
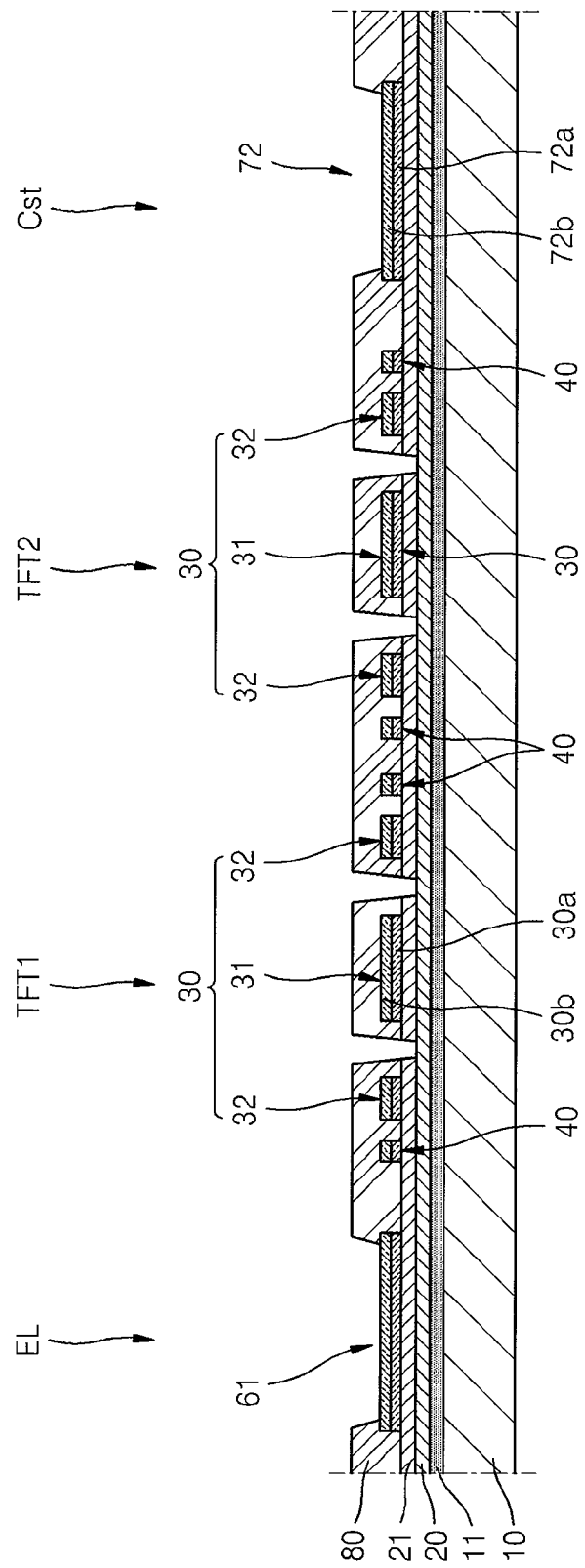
Figure 2F:
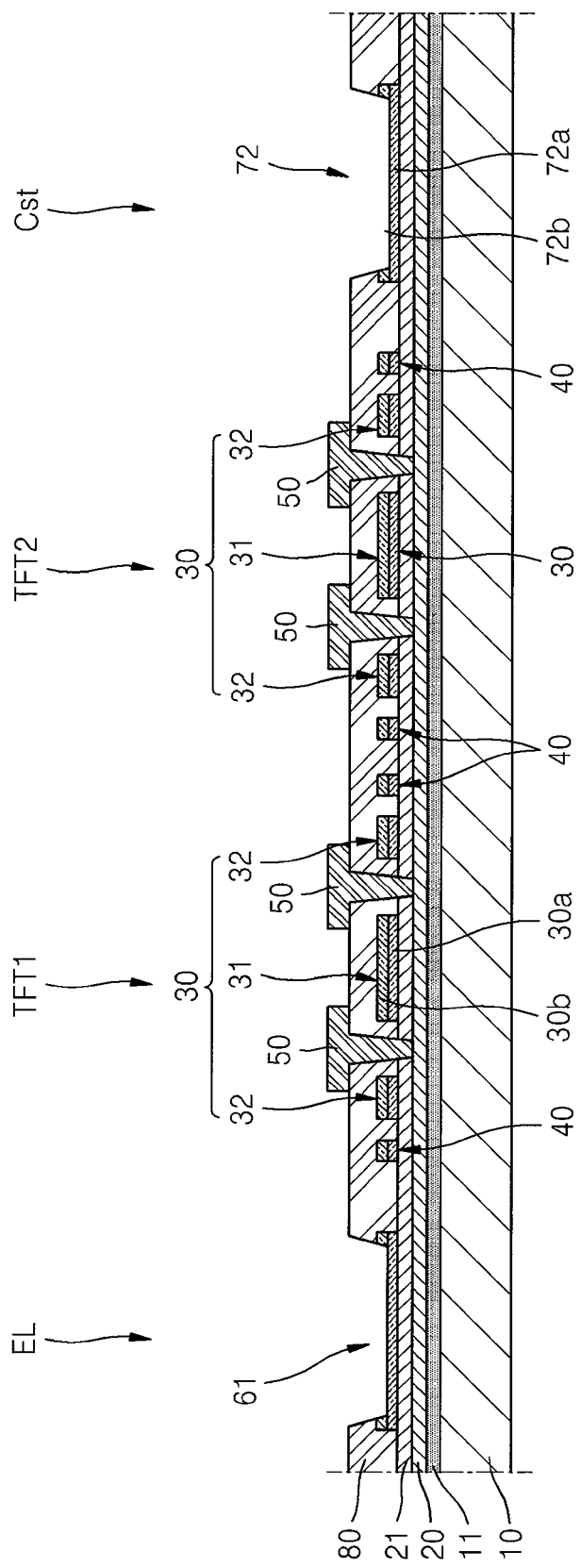
Figure 2G:
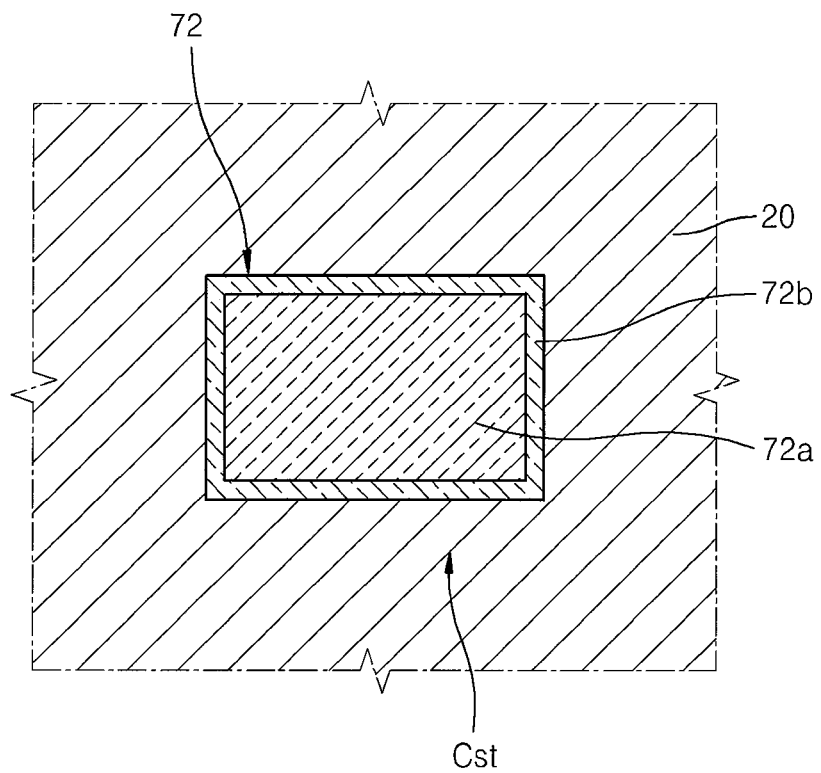

The upper electrode 72 is formed of a first upper electrode 72a opposing the lower electrode 71, and a second upper electrode 72b surrounding the first upper electrode 72a (see, for example, FIG. 2G). In addition, the lower electrode 71 is not formed as a separate layer but is instead formed by using a portion of the active layer 20. That is, a region of the active layer 20 corresponding to the capacitor Cst is used as the lower electrode 71. The capacitor Cst should be electrically separated from other adjacent devices. In this regard, the second upper electrode 72b of the upper electrode 72 functions to make an electrical separation structure. A detailed description thereof appears below.

Next, a process of manufacturing the organic light-emitting display device of FIG. 1 will now be described with reference to FIGS. 2A through 2H.

First, referring to FIG. 2A, a buffer layer 11 is formed on the substrate 10 to make the surface of the substrate 10 smooth and to reduce or prevent penetration by foreign substances. Next, the active layer 20 is uniformly formed thereon. The substrate 10 may be formed, for example, of a transparent glass material, and the active layer 20 may be formed, for example, of a polycrystalline silicon material.

Next, as illustrated in FIG. 2B, the first insulating layer 21 is formed on the active layer 20. That is, without separately performing mask pattering on the active layer 20, the first insulating layer 21 is directly formed on the active layer 20. Thus, a mask process with respect to the active layer 20 may be omitted, compared to a conventional manufacturing method. Instead, electrical separation between devices that might otherwise be addressed by patterning the active layer 20 is instead addressed via processes to be described below. The first insulating layer 21 may be formed by depositing an inorganic insulation layer such as SiNx or SiOx by using a plasma-enhanced chemical vapor deposition (PECVD) method, an atmospheric pressure chemical vapor deposition (APCVD) method, a low pressure chemical vapor deposition (LPCVD) method, or the like.

Next, as illustrated in FIG. 2C, the pixel electrode 61 of the organic light-emitting diode EL, the gate electrode 30 of TFT1 and TFT2, and the upper electrode 72 of the capacitor Cst are formed on the first insulating layer 21. That is, two conductive layers are sequentially formed on the first insulating layer 21, and then a pattern of the pixel electrode 61, the gate electrode 30, and the upper electrode 72 is formed by a mask process using a first mask. Here, one of the two conductive layers is first formed as a lower layer and may include at least one transparent material selected from the group consisting of ITO, IZO, ZnO, and $In_2O_3$. The transparent material layer becomes the pixel electrode 61, the first electrode 30a, and the first upper electrode 72a of the capacitor Cst.

The other one of the two conductive layers is then formed as an upper layer and may include at least one metal material selected from the group consisting of Ag, Mg, Al, Pt, Pd, Au, Ni, Nd, Ir, Cr, Li, Ca, Mo, Ti, W, MoW, and Al/Cu. The metal material layer is patterned as the upper gate electrode 30b, and the second upper electrode 72b of the capacitor Cst.

Then, the gate guard 40 that is formed of the same material in the same layer as the metal material is patterned together with the metal material. The gate guard 40 surrounds the gate electrode 30, and functions to cause electrical separation between adjacent devices of the active layer 20 in a subsequent doping process.

FIG. 2D is a plan view illustrating pattern shapes of the gate electrode 30 and the gate guard 40. As illustrated in FIG. 2D, the gate guard 40 surrounds the gate electrode 30. Thus, the gate guard 40 may have a region different from the adjacent device. As described above, the gate electrode 30 is formed of the gate center portion 31 and the gate side portions 32, and a central space (where the gate electrode 30 is not formed) is arranged between the gate center portion 31 and each of the gate side portions 32.

Afterward, n-type impurity doping or p-type impurity doping is performed from an upward direction in FIG. 2C. Then, impurities do not pass through a portion covered by the metal material layer but passes through a portion not covered by the metal material layer, so that the active layer 20 is doped with the impurities. Thus, as illustrated in FIG. 2D, in the gate electrode 30, the active layer 20 is doped with impurities via the central space arranged between the gate center portion 31 and each of the gate side portions 32. The source-drain electrodes 50 are later connected to the active layer 20 doped with the impurities via the central spaces.

Furthermore, since the gate guard 40 covered by a metal material layer is formed in an outer boundary region of the gate electrode 30, a portion of the active layer 20 which is below the gate guard 40 is not doped with the impurities. Accordingly, the active layer 20 is electrically separated from adjacent devices. That is, doping is performed by using the gate electrode 30 and the gate guard 40 as a mask. In addition, the pixel electrode 61 of the organic light-emitting diode EL and the upper electrode 72 of the capacitor Cst are still covered by a metal material layer. Thus, portions of the active layer 20 below these structures are not doped.

Next, as illustrated in FIG. 2E, a second insulating layer 80 is deposited on the entire surface of the substrate 10, and then openings having a predetermined pattern are formed via a mask process using a second mask. The openings expose the pixel electrode 61 of the organic light-emitting diode EL and the upper electrode 72 of the capacitor Cst. In addition, in the gate electrode 30, the doped portion of the active layer 20 corresponding to the source-drain electrodes 50 is exposed via the central space arranged between the gate center portion 31 and each of the gate side portions 32. The second insulating layer 80 may be formed of at least one organic insulating material selected from the group consisting of polyimide, polyamide, acryl resin, benzocyclobutene, and phenol resin by using a spin coating method.

Afterward, as illustrated in FIG. 2F, a conductive layer is deposited on the entire surface of the substrate 10, and then the source-drain electrodes 50 are formed via a mask process using a third mask. The conductive layer may be formed as a metal material layer, deposited with a thickness sufficient to fill the openings, and then removed except for the source-drain electrodes 50 via the mask process. In addition, portions of the metal material layer (that is, the upper layer of the two conductive layers formed as illustrated in FIG. 2C) remaining in the pixel electrode 61 of the organic light-emitting diode EL and the upper electrode 72 of the capacitor Cst are also removed by, for example, performing etching.

However, side edges of each of the pixel electrode 61 and the upper electrode 72 are buried in the second insulating layer 80 so that the side edges are not removed but remain after the etching. The upper electrode 72 of the capacitor Cst that has the remaining side edges performs like a mask similar to the gate guard 40 of the gate electrode 30. That is, after the source-drain electrodes 50 are formed, doping is performed to form the lower electrode 71 of the capacitor Cst.

At this time, as illustrated in FIG. 2G, the remaining second upper electrode 72b surrounds the first upper electrode 72a, and thus doping is not performed on a portion of the active layer 20 that is below the remaining second upper electrode 72b. Therefore, doping is performed on a portion of the active layer 20 that opposes the first upper electrode 72a but the doping is not performed on the portion of the active layer 20 that is below the remaining second upper electrode 72b. Accordingly, a boundary line that electrically separates the active layer 20 from adjacent devices is formed. Thus, although the active layer 20 is not patterned by using a separate mask, it is possible to form the active layer 20 and the lower electrode 71 that are electrically separated from adjacent devices and that function appropriately for TFT1, TFT2, and the capacitor Cst.

Figure 2H:
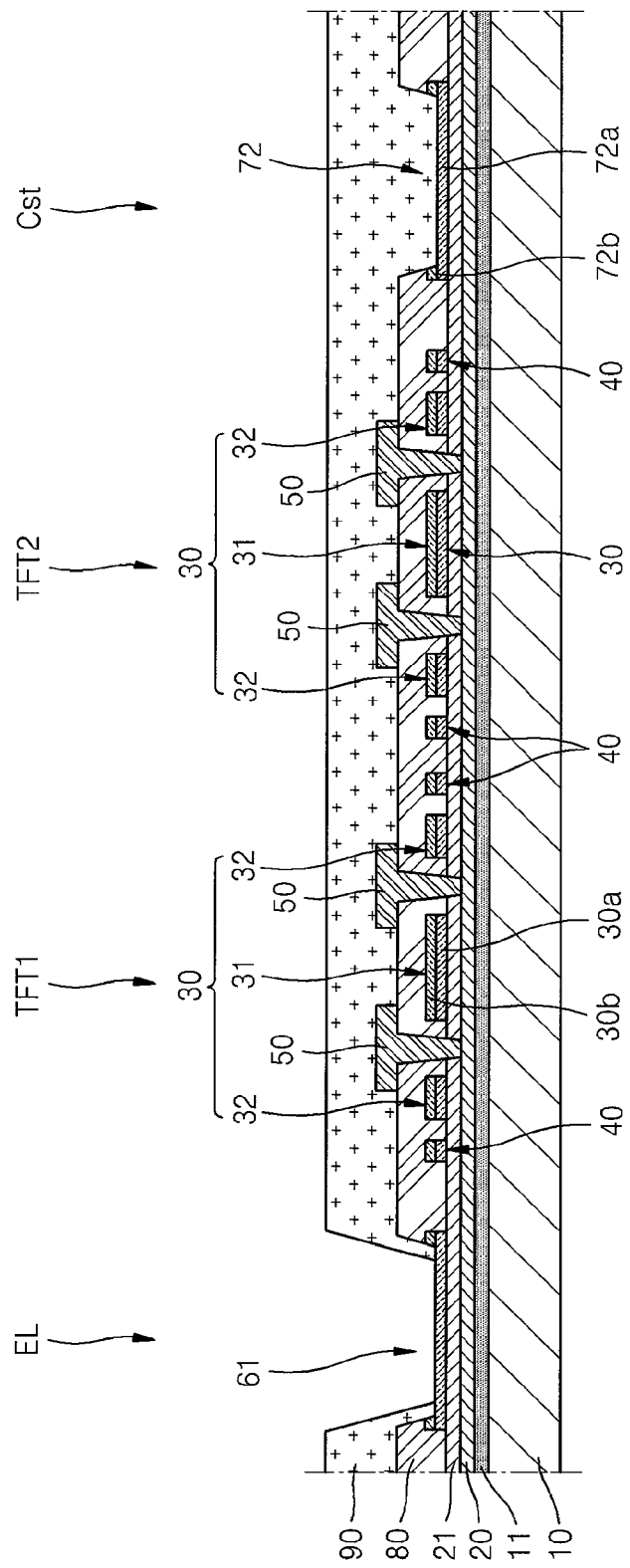

Next, as illustrated in FIG. 2H, a pixel-defining layer (PDL) 90 is formed on the substrate 10. The PDL 90 may be formed of at least one organic insulating material selected from the group consisting of polyimide, polyamide, acryl resin, benzocyclobutene, and phenol resin. Further, an opening for exposing a center portion of the pixel electrode 61 is formed via a mask process using a fourth mask.

Afterward, as illustrated in FIG. 1, the emission layer 62 and the opposite electrode 63 are formed on the pixel electrode 61. Although not illustrated, an encapsulation member and an absorbent for protecting an organic emission layer against external moisture or oxygen may be further arranged on the opposite electrode 63. In addition, in each mask process used in forming the organic light-emitting display device, removal of the stacked layers may be performed by dry etching or wet etching.

As described above, according to exemplary embodiments of the organic light-emitting display device and the method of manufacturing the same, the substrate through the PDL may be manufactured by using only four masks, so that the manufacturing costs may be decreased and the manufacturing processes may be simplified due to a decrease in the number of masks. Also, as described above, according to exemplary embodiments of the organic light-emitting display device and the method of manufacturing the same, a mask patterning process with respect to the active layer 20 is omitted, so that the manufacturing costs may be decreased and the manufacturing processes may be simplified due to a decrease of the number of masks.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display device comprising:
   a substrate;
   an active layer uniformly covering an entire surface of the substrate;
   a thin film transistor (TFT) on the substrate and comprising:
     a portion of the active layer;
     a gate electrode on the active layer with a gate insulating layer therebetween; and
     a gate guard surrounding the gate electrode to define a region of the TFT; and
   an organic light-emitting diode and a capacitor on the substrate and that are electrically connected to the TFT.

2. The organic light-emitting display device of claim 1, wherein the TFT further comprises:
   a source-drain electrode connected to the active layer.

3. The organic light-emitting display device of claim 2, wherein the gate electrode and the gate guard are formed in a same layer by using a same material.

4. The organic light-emitting display device of claim 2, wherein the TFT comprises a plurality of TFTs of which corresponding said regions are separately defined by respective said gate guards.

5. The organic light-emitting display device of claim 2, wherein the gate electrode comprises:
   a gate center portion; and
   a gate side portion extending from the gate center portion and forming a closed loop shape with the gate center portion.

6. The organic light-emitting display device of claim 5, wherein the source-drain electrode passes through a central space of the closed loop shape to connect to the active layer via the central space.

7. The organic light-emitting display device of claim 1, wherein the organic light-emitting diode comprises:
   a pixel electrode electrically connected to the TFT;
   an opposite electrode facing the pixel electrode; and
   an emission layer interposed between the pixel electrode and the opposite electrode.

* * * * *